(12) United States Patent
Mizuhara

(10) Patent No.: US 6,417,709 B1
(45) Date of Patent: Jul. 9, 2002

(54) AUTOMATIC DUTY CYCLE CONTROLLER FOR ULTRA HIGH SPEED DIGITAL MULTIPLEXER

(75) Inventor: Osamu Mizuhara, Allentown, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/070,350

(22) Filed: Apr. 30, 1998

(51) Int. Cl.[7] .................................................. H03K 5/04
(52) U.S. Cl. ........................................ 327/175; 327/407
(58) Field of Search .......................... 327/175, 407–411

(56) References Cited

U.S. PATENT DOCUMENTS 5,345,504 A * 9/1994 West, Jr. ........................ 380/7

* cited by examiner

Primary Examiner—Kenneth B. Wells
(74) Attorney, Agent, or Firm—Mayer, Fortkort & Williams, LLC

(57) ABSTRACT

A duty cycle controller provides a uniform 50% duty cycle in a 2:1 digital multiplexer without an upper operating frequency limit. The multiplexer uses a comparator to generate interleaving signals by comparing a clock signal to a comparator set point. A feedback loop includes a bandpass filter, a power detector and an integrator, connected in series between the multiplexer output and the comparator. The bandpass filter passes components of the multiplexed output signal with a frequency substantially equal to the main clock frequency of the multiplexer. Signal components at that frequency are a second harmonic of the fundamental frequency of the multiplexed signal and therefore will not be present in the multiplexed signal if its duty cycle is exactly 50%. The power level of those frequency components is integrated over a suitable time period and the integrated signal is used to adjust the set point of the comparator. The feedback loop thus controls the duty cycle of the multiplexed signal to minimize the frequency components passed by the bandpass filter and thereby maintain the duty cycle of the multiplexed signal at 50%.

18 Claims, 2 Drawing Sheets

AUTOMATIC DUTY CYCLE CONTROLLER FOR ULTRA HIGH SPEED DIGITAL MULTIPLEXER

BACKGROUND OF THE INVENTION

1. Field of the Invention

The present invention relates to a duty cycle controller and, more particularly, to an automatic duty cycle controller for an ultra high-speed digital multiplexer.

2. Description of Related Art

Digital multiplexers are widely used in time division multiplexing systems. Typically, such a digital multiplexer will include a logic circuit with components such as gates and flip-flops. For example, a prior art 2:1 multiplexer with a non-return-to-zero ("NRZ") format output interleaves two relatively low-frequency digital input signals using a high-speed clock. A logic circuit samples the input signals at a rate determined by the clock signal and interleaves the signals. A typical low-speed prior art multiplexer includes a D-type flip-flop that re-times the output signal to remove any imperfections that may have occurred during interleaving. That is, the multiplexed signal is passed through a D-type flip-flop under the control of the clock signal used to sample the data signals for multiplexing. The D-type flip-flop thus provides the two interleaved signals with a precisely controlled 50% duty cycle.

However, as the speed of the multiplexer (the frequency of the clock signals) increases, it becomes increasingly difficult to provide the multiplexed output signal with a 50% duty cycle. A major source of difficulty is that the operation of D-type flip-flops degrades at a frequency above about 10 GHz. Consequently, higher-speed multiplexers often omit the D-type flip-flop. Unfortunately, this degrades the multiplexer output because of imperfect multiplexing by the logic circuit that performs the interleaving operation. That is, without the D-type flip-flop, the interleaving imperfections introduced by the logic circuit remain in the output.

The most common imperfection is output duty cycle offset caused by drift in the logic circuit. The problems caused by this phenomenon have particularly serious consequences in communication systems because it causes a serious strain on the transmission signal. For example, in an optical fiber communications system using an NRZ data format it is critical that the interleaved signals have a uniform duty cycle. If they do not, severe difficulties arise in decoding the signal at its destination.

A high-speed multiplexed signal is illustrated in FIG. 2, which shows the output from a prior art 2:1 multiplexer operating at 20 GHz without a D-type flip-flop. It will be appreciated that duty cycle of this signal varies over time, in that the pulse width $W_a$ is shorter than the pulse width $w_b$. As a result, the output signal is degraded in terms of its signal-to-noise ratio, inter-symbol interference and its timing margin. All of these properties of the signal are important in accurately reproducing the original signal at the signal's destination.

Consequently, there is a need to be able to control the output signal duty cycle in a multiplexer operating at a frequency greater than the operational speed of a D-type flip-flop, and achieve an equal and stable pulse width in each time slot of the multiplexed signal.

SUMMARY OF THE INVENTION

It is an object of the present invention to provide automatic duty cycle control in an ultra high-speed digital multiplexer.

In accordance with one aspect of the invention, a duty cycle controller for a multiplexer using a comparator for providing at an output of the multiplexer two interleaved data signals by comparing a clock signal having a predetermined frequency to a comparator set point comprises a bandpass filter for providing to an output a signal having a frequency substantially equal to the frequency of the clock signal, the bandpass filter having an input for connection to the output of the multiplexer, a power detector having an input for accepting the bandpass filter output signal and providing at an output of the power detector a signal indicating the power level of the bandpass filter output signal, and an integrator for integrating the power detector output signal over a predetermined period of time and providing a reference signal for adjusting the set point of the comparator.

In accordance with another aspect of the invention, a multiplexer comprises a comparator for outputting two interleaving signals by comparing a clock signal having a predetermined frequency to a comparator set point, a logic circuit for outputting a multiplexed signal by using the interleaving signals to interleave two data signals input to the logic circuit, a bandpass filter for accepting the logic circuit output and providing to an output of the bandpass filter a signal comprising components of the logic circuit output signal having a frequency substantially equal to the frequency of the clock signal, a power detector having an input for accepting the bandpass filter output signal and providing at an output of the power detector a signal indicating the power level of the bandpass filter output signal, and an integrator for integrating the power detector output signal over a predetermined period of time and providing a reference signal used to adjust the set point of the comparator.

According to yet another aspect of the present invention, a method for controlling the duty cycle of a multiplexer using a comparator for providing at an output of the multiplexer two interleaved data signals by comparing a clock signal having a predetermined frequency to a comparator set point comprises the steps of filtering the output of the multiplexer to provide a filtered signal having a frequency substantially equal to the frequency of the clock signal, detecting the power of the filtered signal, and integrating the power of the filtered signal over a predetermined period of time to provide a reference signal for adjusting the set point of the comparator.

BRIEF DESCRIPTION OF THE DRAWINGS

The present invention will be better understood from the detailed description of its preferred embodiments which follows below, when taken in conjunction with the accompanying drawings, in which like numerals refer to like features throughout. This brief identification of the drawing figures will aid in understanding the detailed description that follows.

DETAILED DESCRIPTION OF THE PREFERRED EMBODIMENTS

Figure 1:
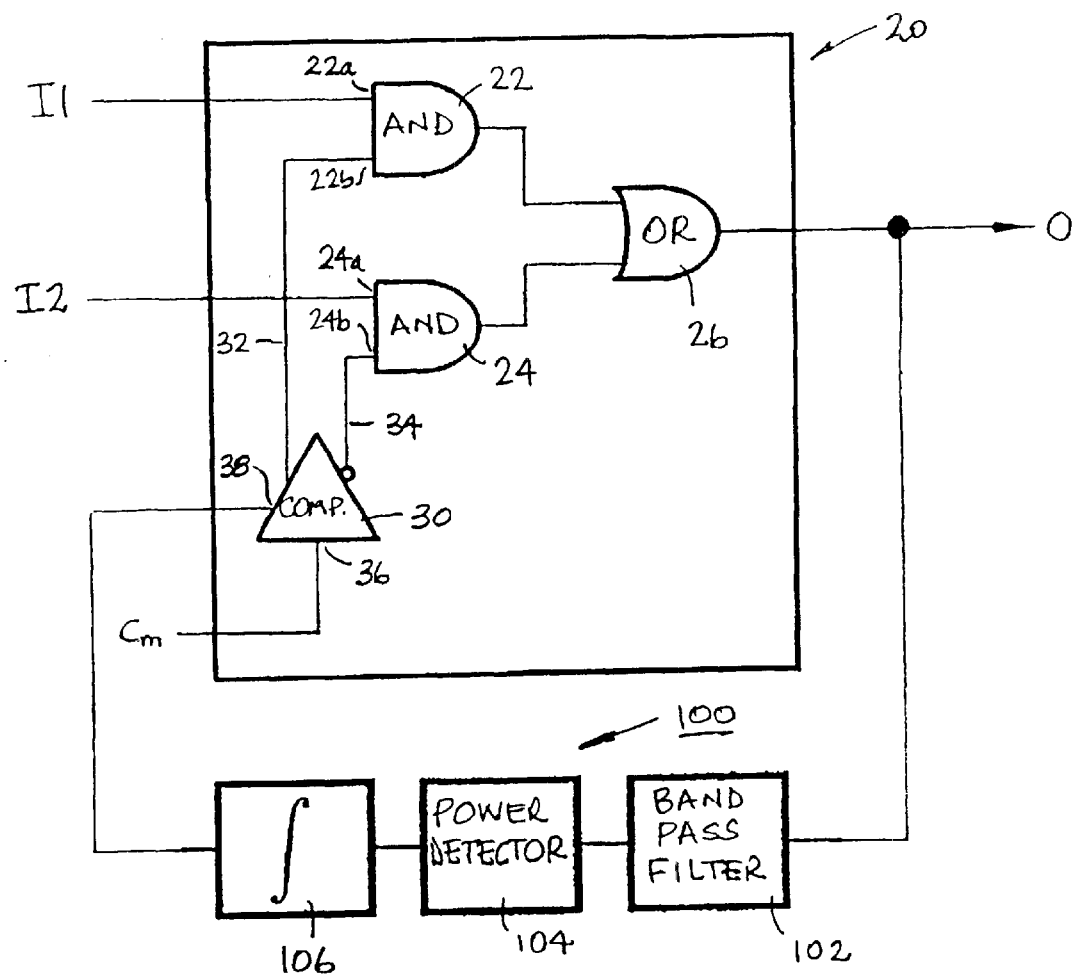
FIG. 1 is a schematic circuit diagram of a conventional multiplexer circuit to which the present invention has been applied.

FIG. 1 illustrates a conventional 2:1 multiplexer 20 with two input terminals I1 and I2 for receiving data signals that are to be interleaved. The 2:1 multiplexer 20 includes a first AND gate 22 and a second AND gate 24. The input signal I1 is introduced to a data input 22a of the AND gate 22 and the input signal I2 is introduced to a data input 24a of the AND gate 24. The 2:1 multiplexer also includes an OR gate 26, the output of which is connected to the output O of the 2:1 multiplexer. The AND gates are controlled by an operational amplifier 30. One interleaving signal 32 from the amplifier is connected to a timing input 22b of the AND gate 22. The other interleaving signal 34 from the amplifier 30 is inverted and introduced to the timing input 24b of the AND gate 24.

The amplifier 30 can be in the nature of a comparator that provides a digital signal at its outputs in response to a sine-wave main clock signal $C_m$ introduced to the amplifier's main input 36. As is conventional, the amplifier 30 outputs a digital "1" as one of the interleaving signals 32 and 34 (and a digital "0" as the other interleaving signal) when the main clock signal $C_m$ is greater than a reference signal applied to a reference input 38 of the amplifier.

Figure 2:
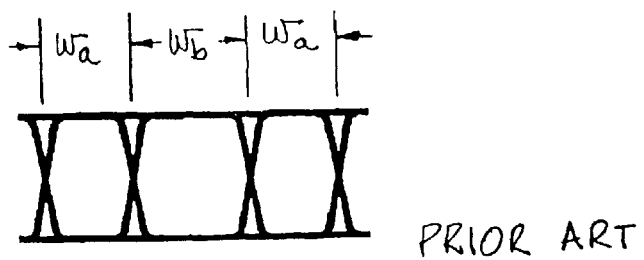
FIG. 2 is shows the output of the conventional multiplexer circuit in FIG. 1.

Theoretically, the amplifier 30 provides the interleaving signals 32 and 34 at a duty cycle corresponding to the frequency of the main clock signal $C_m$ at the main input 36 of the amplifier 30. However, the set point of the amplifier as determined by the reference signal will unavoidably drift over time due to environmental effects. As a result the output of the OR gate 26 will assume the form shown in FIG. 2. As those skilled in the art will appreciate, this causes severe degradation of the signal in terms of its signal-to-noise ratio, inter-symbol interference and timing margin. These distortions can have serious implications in many applications, for example, when the signal is to be used to generate a digital optical signal in an NRZ format that must be decoded after traveling large distances.

Accordingly, as discussed above, the prior art typically uses a D-type flip-flop under the control of the main clock signal $C_m$ to re-time the output from the OR gate 26. However, at ultra high frequencies, (say, above 10 Ghz), a D-type flip-flop cannot be relied upon accurately to re-time the output signal. And the prior art approach of simply omitting the flip-flop is clearly not a solution. Instead, the present invention incorporates a feedback loop 100 to control the operational amplifier 30. This feedback loop includes, in series, a bandpass filter 102, a power detector 104 and an integrator 106. These are all conventional circuit elements that, once their operational parameters are defined, can be easily constructed by those skilled in the art.

The band pass filter 102 is preferably a narrowband (high-Q), dielectric resonator filter designed to pass a signal having a frequency equal to the frequency of the main clock signal $C_m$. Of course, other types of band pass filters may be used without departing from the scope of the present invention. In the experiment testing the present invention a bandpass filter with Q=$10^3$ was used. Since $C_m$=20 GHz, the bandwidth of the filter was 20 MHz, with a design frequency of 20 GHz. The power detector 104 used in the experiment was a known, commercially available model capable of detecting the power of the signal from the band pass filter 102 at nanowatt levels ($10^9$ watts). It will be appreciated by those skilled in the art that a less sensitive, and therefore less expensive, power detector may be used without departing from the scope of the invention simply be amplifying the output of the band pass filter 102. By way of example, an amplifier with a 20 db to 30 db gain at 20 GHz would in most applications increase the power level of the band pass filter output a sufficient amount to permit use of an inexpensive power detector.

The bandpass filter and the power detector together detect the degree to which the duty cycle of the signal output from the OR gate 26 deviates from 50%. This is an inherent property of the OR gate's output, in that it always contains a "0" followed by a "1" over a given time interval. Such a sequence in the output will be at exactly one-half the frequency of the main clock signal $C_m$ provided the duty cycle of the OR gate output is exactly 50%. However, if the duty cycle of the output is not exactly 50%, such a 0-1 sequence in the signal will also have a second harmonic frequency at the main clock signal $C_m$. Accordingly, the power of the signal at the frequency $C_m$ ideally is zero, because by definition there will be no signal at precisely the frequency of $C_m$ if the duty cycle of the multiplexed signal is exactly 50%. The present invention utilizes this property of the output of the OR gate 26 by incorporating the feedback loop 100, the purpose of which is to minimize the power in the signal at the design frequency of the multiplexer circuit.

The output of the power detector 104 therefore represents the degree to which the duty cycle of the OR circuit output deviates from 50%. The integrator 106 is provided in the circuit to control the time over which the multiplexer output is monitored for power at the multiplexer's design frequency. It is typically a simple capacitor circuit with either an adjustable or fixed set point. Providing such a circuit is well within the ability of one skilled in the art. Since the set point of the operational amplifier 30 will drift over a period of about one millisecond to one second, and it is preferable that as many 0-1 pulses as possible are sampled, a time period of 1 msec. to 1 sec. is typically chosen as the period over which the output of the power detector is integrated. However, the present invention is not limited to any particular integration time, and those skilled in the art will be able to chose a suitable integration time depending on the application. In the experiment used to test the present invention, the integration time was 1 second.

The integrated detector output from the integrator 106 is used to adjust the level of the reference input 38 of the amplifier 30, thereby changing its set point. If it is necessary to adjust the voltage level of the output of the integrator 106 to enable it to be used as the reference input to the comparator 30, a suitable bias voltage may be applied to the integrator output. Accordingly, the duty cycle of the interleaving signals will be adjusted so that the multiplexed signals output from the OR gate 26 maintain a duty cycle very close to 50%.

Figure 3:
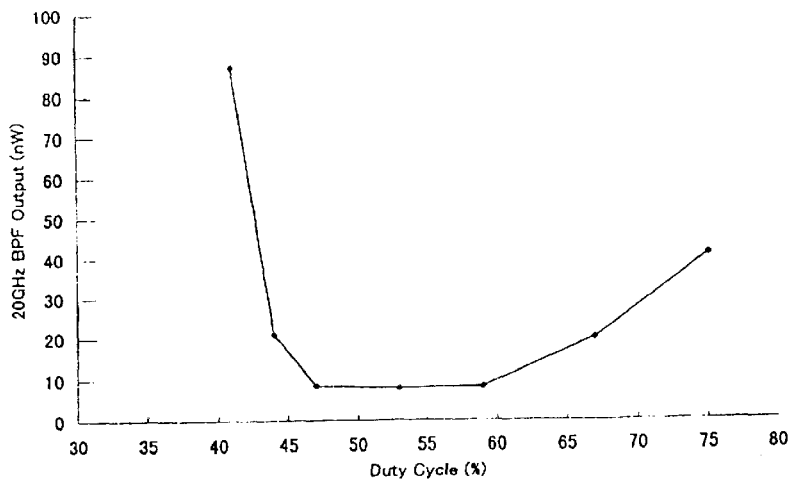
FIG. 3 plots the output of the power detector, which is a component of the embodiment of the present invention shown in FIG. 1, against the duty cycle of the output signal of the multiplexer in FIG. 1 for randomly generated 20 GHz input signals.

The effect of the present invention is therefore to provide two multiplexed signals with a duty cycle equal to 50%, within very close limits. As pointed out above, the invention was tested for a 20 GHz main clock signal $C_m$ used to multiplex two signals generated by a pseudorandom signal generator with a repeat rate of $2^{31}$-1. Under these severe test conditions, the output of the power detector 104 was as shown in FIG. 3. As this plot of power output in nW against the duty cycle of the multiplexed signal illustrates, adjusting the set point of the amplifier 30 in order to minimize the power of the multiplexed signal at the main clock frequency $C_m$ maintains the duty cycle in an acceptable range close to 50%.

The present invention can also be used to multiplex more than two signals. One way to accomplish that result would be to connect a series of 2:1 multiplexers in a multiplexer tree and only apply the invention to the final multiplexer.

Figure 4:
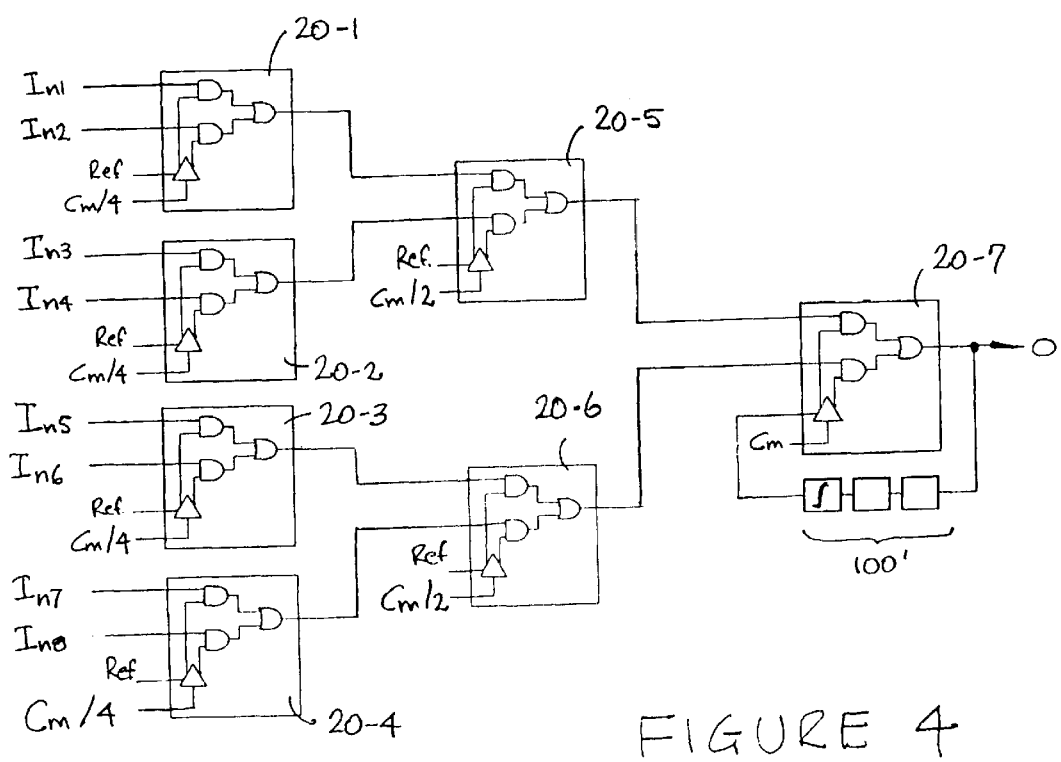
FIG. 4 illustrates the application of the present invention to an 8:1 multiplexer.

FIG. 4 depicts an 8:1 multiplexer tree incorporating seven 2:1 multiplexers similar to the prior art multiplexer 20 in FIG. 1. Each of four input multiplexers 20-1 to 20-4 accept two of eight input data signals $I_{n1}$ to $I_{n8}$ to be interleaved. The outputs of the input multiplexers 20-1 and 20-2 are then multiplexed in one intermediate multiplexer 20-5 and the outputs of the input multiplexers 20-3 and 20-4 are multiplexed in a second intermediate multiplexer 20-6. The outputs of the two multiplexers 20-5 and 20-6 are multiplexed in a final multiplexer 20-7 operating at a high speed, say 20 GHz. A feedback loop 100' in accordance with the present invention is then applied to the final multiplexer 20-7.

If the final multiplexer is operating at a main clock speed of 20 GHz, the multiplexers 20-5 and 20-6 are operating at 10 GHz, and the initial multiplexers are operating at 5 GHz. Both of those frequencies are low enough that a D-type flip-flop can be used to ensure a 50% duty cycle. (D-type flip-flops are omitted from FIG. 4 for clarity.) In practice, it will likely prove feasible always to use flip-flops to re-time the output of all but the last multiplexer in a tree such as that shown in FIG. 4. However, a feedback loop in accordance with the present invention may also be incorporated into multiplexers other than the final one in a multiplexer tree.

While preferred embodiments of the invention have been depicted and described, it will be understood that various changes and modifications can be made other than those specifically mentioned above without departing from the spirit and scope of the invention, which is defined solely by the claims that follow.

What is claimed is:

1. A duty cycle controller for a multiplexer using a comparator for providing at an output of the multiplexer two interleaved data signals by comparing a clock signal having a predetermined frequency to a comparator set point, the duty cycle controller comprising:

a bandpass filter for providing to an output a signal having a frequency substantially equal to the frequency of the clock signal, said bandpass filter having an input for connection to the output of the multiplexer;

a power detector having an input for accepting the bandpass filter output signal and providing at an output of said power detector a signal indicating the power level of the bandpass filter output signal; and an integrator for integrating the power detector output signal over a predetermined period of time and providing a reference signal for adjusting the set point of the comparator.

2. A duty cycle controller as in claim 1, wherein the predetermined frequency is greater than 10 GHZ.

3. A duty cycle controller as in claim 1, wherein said bandpass filter comprises a high-Q filter.

4. A duty cycle controller as in claim 3, wherein said bandpass filter comprises a dielectric resonator filter.

5. A duty cycle controller as in claim 1 for controlling the duty cycle of a multiplexer that outputs interleaved data signals in a non-return-to-zero digital format, wherein said integrator integrates the power detector output signal over an integration time sufficient to include multiple "0" to "1" transitions of the multiplexer output.

6. A duty cycle controller as in claim 5, wherein the integration time is between one millisecond and one second.

7. A multiplexer comprising:

a comparator for outputting two interleaving signals by comparing a clock signal having a predetermined frequency to a comparator set point;

a logic circuit for outputting a multiplexed signal by using the interleaving signals to interleave two data signals input to said logic circuit;

a bandpass filter for accepting the logic circuit output and providing to an output of said bandpass filter a signal comprising components of the logic circuit output signal having a frequency substantially equal to the frequency of the clock signal;

a power detector having an input for accepting the bandpass filter output signal and providing at an output of said power detector a signal indicating the power level of the bandpass filter output signal; and an integrator for integrating the power detector output signal over a predetermined period of time and providing a reference signal used to adjust the set point of said comparator.

8. A multiplexer as in claim 7, wherein said bandpass filter comprises a high-Q filter.

9. A multiplexer as in claim 7, wherein the predetermined frequency is greater than 10 GHZ.

10. A multiplexer as in claim 9, wherein the predetermined frequency is 20 GHz and $Q=10^3$.

11. A multiplexer as in claim 7, said multiplexer outputting interleaved data signals in a non-return-to-zero digital format, wherein said integrator integrates the power detector output signal over an integration time sufficient to include multiple "0" to "1" transitions of the multiplexer output.

12. A multiplexer as in claim 11, wherein the integration time is between one millisecond and one second.

13. A multiplexer as in claim 7, further comprising a plurality of 2:1 multiplexers arranged in a multiplexer tree for providing the two data signals connected to said comparator.

14. A multiplexer as in claim 13, wherein each of said plurality of 2:1 multplexers includes a comparator for outputting interleaving signals using a clock signal generated by dividing the first-mentioned clock signal.

15. A method for controlling the duty cycle of a multiplexer using a comparator for providing at an output of the multiplexer two interleaved data signals by comparing a clock signal having a predetermined frequency to a comparator set point, the method comprising the steps of:

filtering the output of the multiplexer to provide a filtered signal having a frequency substantially equal to the frequency of the clock signal;

detecting the power of the filtered signal; and integrating the power of the filtered signal over a predetermined period of time to provide a reference signal for adjusting the set point of the comparator.

16. A method as in claim 15 for controlling the duty cycle of a multiplexer that outputs interleaved data signals in a non-return-to-zero digital format, wherein said integrating step is performed over an integration time sufficient to include multiple "0" to "1"transitions of the multiplexer output.

17. A method in claim 16, wherein the integration time is between one millisecond and one second.

18. A method as in claim 15, wherein the predetermined frequency is greater than 10 GHZ.

* * * * *